(12) United States Patent
Yamashita et al.

(10) Patent No.: US 11,594,464 B2
(45) Date of Patent: Feb. 28, 2023

(54) SEMICONDUCTOR DEVICE AND SEMICONDUCTOR DEVICE MANUFACTURING METHOD

(71) Applicant: Mitsubishi Electric Corporation, Tokyo (JP)

(72) Inventors: Tetsuo Yamashita, Tokyo (JP); Koichi Masuda, Tokyo (JP); Hiroki Muraoka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 76 days.

(21) Appl. No.: 17/075,795

(22) Filed: Oct. 21, 2020

(65) Prior Publication Data

US 2021/0202342 A1    Jul. 1, 2021

(30) Foreign Application Priority Data

Dec. 26, 2019    (JP) .............................. JP2019-236061

(51) Int. Cl.

| *H01L 23/367* | (2006.01) |
|---|---|
| *H01L 23/373* | (2006.01) |
| *H01L 23/31* | (2006.01) |
| *H01L 23/433* | (2006.01) |

(52) U.S. Cl.
CPC .......... *H01L 23/367* (2013.01); *H01L 23/373* (2013.01); *H01L 23/3107* (2013.01); *H01L 23/4334* (2013.01)

(58) Field of Classification Search
CPC . H01L 23/367; H01L 23/373; H01L 23/3735; H01L 21/4882; H01L 23/3677; H01L 21/4871; H01L 23/13; H01L 23/4334; H01L 23/3107
See application file for complete search history.

(56) References Cited

U.S. PATENT DOCUMENTS

2015/0255367 A1    9/2015  Nakahara et al.

FOREIGN PATENT DOCUMENTS

| JP | 2015-170786 A | 9/2015 |
|---|---|---|
| JP | 2017-079244 A | 4/2017 |
| JP | 2017-224790 A | 12/2017 |

OTHER PUBLICATIONS

JP 2017-079244 (Year: 2017).*
JP 2017-224790 (Year: 2017).*
(Continued)

*Primary Examiner* — Patricia D Valenzuela

(74) *Attorney, Agent, or Firm* — Studebaker & Brackett PC

(57) ABSTRACT

A semiconductor device includes a semiconductor element, a base plate, and a plurality of contact materials. The base plate has a front surface holding the semiconductor element and a rear surface to which a cooling body to cool the semiconductor element is attachable. The plurality of contact materials are discretely arranged on the rear surface of the base plate. The plurality of contact materials are materials for bridging a gap on a heat dissipation path between the base plate and the cooling body. The plurality of contact materials each have a volume based on a bowed shape of the rear surface of the base plate. From among the plurality of contact materials, a contact material at a concave of the bowed shape has a greater volume than a contact material at a convex of the bowed shape.

9 Claims, 10 Drawing Sheets

(56) References Cited

OTHER PUBLICATIONS

An Office Action issued by the German Patent Office dated Jun. 25, 2021, which corresponds to German Application No. 102020132411.1 and is related to U.S. Appl. No. 17/075,795; with English language translation.

An Office Action; "Notice of Reasons for Refusal," mailed by the Japanese Patent Office dated Jan. 17, 2023, which corresponds to Japanese Patent Application No. 2019-236061 and is related to U.S. Appl. No. 17/075,795; with English language translation.

* cited by examiner

SEMICONDUCTOR DEVICE AND SEMICONDUCTOR DEVICE MANUFACTURING METHOD

BACKGROUND OF THE INVENTION

Field of the Invention

The present disclosure relates to semiconductor devices and semiconductor device manufacturing methods.

Description of the Background Art

A cooling body, such as a heat sink, is attached to a semiconductor device, such as an insulated gate bipolar transistor (IGBT) and a free wheel diode (FWD). A mounting surface of the semiconductor device and a mounted surface of the cooling body are each bowed, so that a gap is formed between the semiconductor device and the cooling body. To bridge the gap, a contact material, such as silicon grease, is typically disposed between the semiconductor device and the cooling body. A heat dissipation path from the semiconductor device to the cooling body is thereby secured.

Japanese Patent Application Laid-Open No. 2017-079244 discloses a semiconductor module cooling structure in which a material for a heat conduction part disposed at a concave shape in a central portion of a heat sink is denser than that disposed on the outside thereof.

Compared with the mounted surface of the cooling body, the mounting surface of the semiconductor device is multiply bowed in many cases. A concave of a bow is thus less likely to be filled with the contact material, and a gap is formed on the heat dissipation path from the semiconductor device to the cooling body. In this case, heat dissipation properties of the semiconductor device are deteriorated.

SUMMARY

The present disclosure has been conceived to solve the above-mentioned problem, and it is an object to provide a semiconductor device to achieve appropriate heat dissipation properties even in a case where a mounting surface to which a cooling body is to be attached has a bowed shape.

A semiconductor device according to the present disclosure includes a semiconductor element, a base plate, and a plurality of contact materials. The base plate has a front surface holding the semiconductor element and a rear surface to which a cooling body to cool the semiconductor element is attachable. The plurality of contact materials are discretely arranged on the rear surface of the base plate. The plurality of contact materials are materials for bridging a gap on a heat dissipation path between the base plate and the cooling body. The plurality of contact materials each have a volume based on a bowed shape of the rear surface of the base plate. From among the plurality of contact materials, a contact material at a concave of the bowed shape has a greater volume than a contact material at a convex of the bowed shape.

According to the present disclosure, the semiconductor device to achieve appropriate heat dissipation properties is provided even in a case where a mounting surface to which the cooling body is to be attached has the bowed shape.

These and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
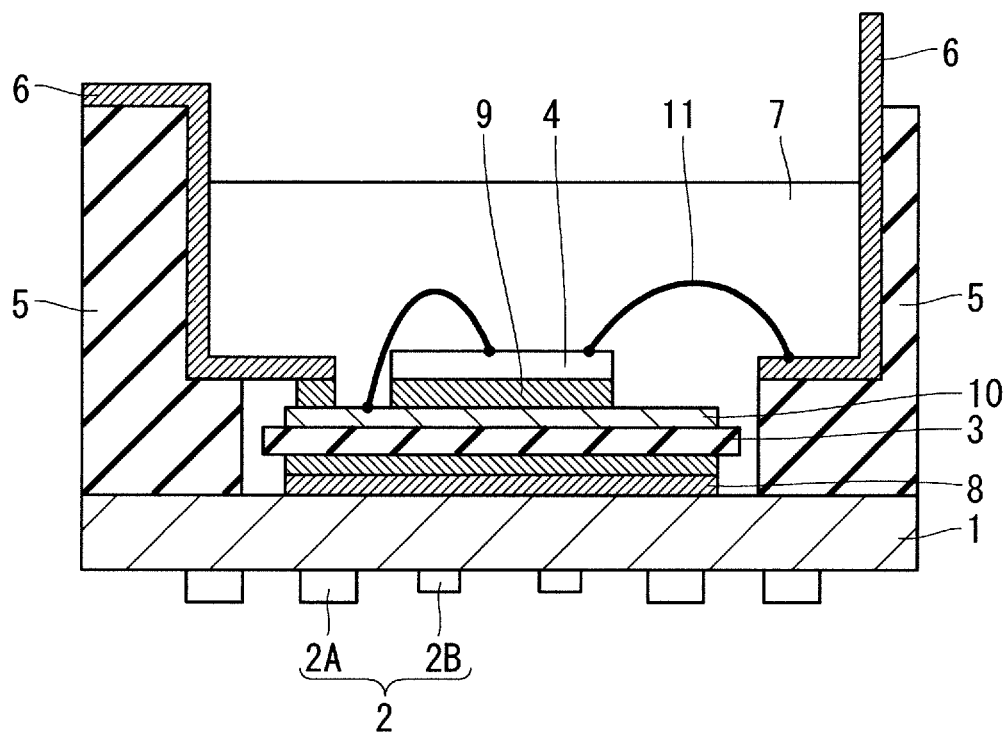
FIG. 1 is a sectional view illustrating a configuration of a semiconductor device in Embodiment 1.

FIG. 1 is a sectional view illustrating a configuration of a semiconductor device in Embodiment 1.

The semiconductor device includes a base plate 1, a plurality of contact materials 2, an insulating substrate 3, a semiconductor element 4, a case 5, an electrode terminal 6, and a sealing material 7.

The base plate 1 has a front surface holding the insulating substrate 3 and the semiconductor element 4 and a rear surface to which a cooling body (not illustrated) to cool the semiconductor element 4 is attachable. The base plate 1 is made, for example, of copper and aluminum.

The insulating substrate 3 is bonded to the front surface of the base plate 1 through a bonding material 8, such as solder. The insulating substrate 3 is made, for example, of ceramic.

The semiconductor element 4 is bonded, through a bonding material 9, such as solder, to a circuit pattern 10 disposed on a front surface of the insulating substrate 3. The semiconductor element 4 is connected to the circuit pattern 10 and the electrode terminal 6, which will be described below, by wires 11 made, for example, of copper or aluminum. The semiconductor element 4 is made, for example, of a semiconductor, such as Si, or a so-called wide-bandgap semiconductor, such as SiC and GaN. The semiconductor element 4 is, for example, an insulated gate bipolar transistor (IGBT), a metal oxide semiconductor field effect transistor (MOSFET), and a free wheel diode (FWD). The semiconductor element 4 is, for example, a power semiconductor element and a control integrated circuit (IC) to control the power semiconductor element.

The case 5 contains therein the insulating substrate 3 and the semiconductor element 4. The case 5 is made, for example, of resin.

The electrode terminal 6 is integrally attached to the case 5, for example. One end of the electrode terminal 6 is connected to the circuit pattern 10 or the semiconductor element 4 by the wire 11. The other end of the electrode terminal 6 is disposed at the top of the case 5, and can be connected to an external circuit.

The sealing material 7 fills a space inside the case 5 to seal the insulating substrate 3, the semiconductor element 4, the wires 11, and the like. The sealing material 7 is, for example, resin and gel.

Figure 2:
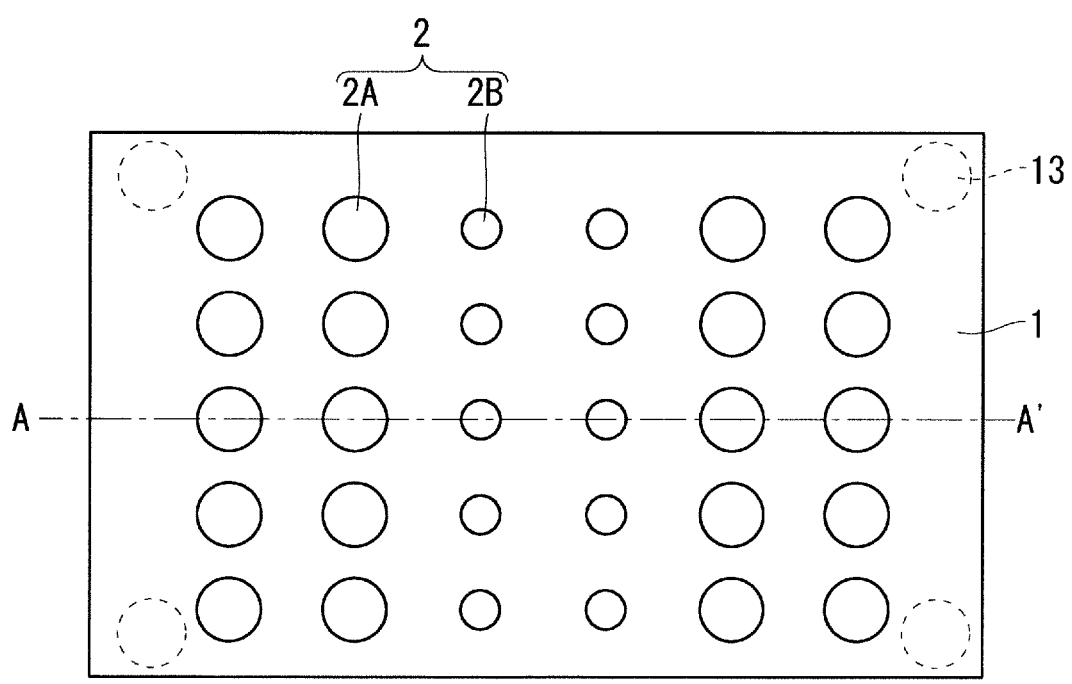
FIG. 2 is a plan view illustrating a configuration of a base plate and contact materials in Embodiment 1.
Figure 3:
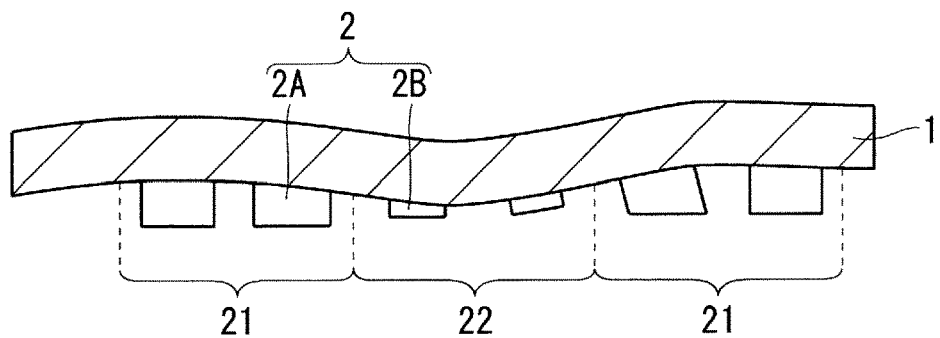
FIG. 3 is a sectional view illustrating the configuration of the base plate and the contact materials in Embodiment 1.

FIGS. 2 and 3 are respectively a plan view and a sectional view illustrating a configuration of the base plate 1 and the contact materials 2 in Embodiment 1. FIG. 3 illustrates a section taken along the line A-A' of FIG. 2.

The rear surface of the base plate 1 is multiply bowed. The bowed shape is, for example, undulation having a smoothly curved surface, and includes a concave 21 and a convex 22. The bowed shape is formed, for example, depending on accuracy of processing of the base plate 1 or through heating and the like in a process of manufacturing the semiconductor device. For ease of description, the degree of undulation of the bowed shape of the base plate 1 is exaggerated in FIG. 3. The cooling body to cool the semiconductor element 4 is attached to the rear surface of the base plate 1 when the semiconductor device is in use. More particularly, the rear surface of the base plate 1 corresponds to the mounting surface of the semiconductor device, and the semiconductor device is attached to the cooling body so that the mounting surface opposes the mounted surface of the cooling body. The rear surface of the base plate 1 has a shape bowed more greatly than the mounted surface of the cooling body. Alternatively, the rear surface of the base plate 1 has more irregularities of the bowed shape than the mounted surface of the cooling body.

The contact materials 2 are discretely arranged on the rear surface of the base plate 1. The contact materials 2 each have a volume based on the bowed shape of the rear surface of the base plate 1. From among the plurality of contact materials 2, a contact material 2A at the concave 21 of the bowed shape has a greater volume than a contact material 2B at the convex 22 of the bowed shape. The contact materials 2 are grease, for example, and spread to bridge a gap between the base plate 1 and the cooling body when the base plate 1 is attached to the cooling body. The contact materials 2 form a heat dissipation path from the semiconductor device to the cooling body. The contact materials 2 are also referred to as heat conduction materials, heat dissipation materials, or thermal interface materials (TIMs).

The bowed shape of the rear surface of the base plate 1 is measured, for example, by a flatness tester. Patterns of the plurality of contact materials 2 are formed, for example, by screen printing. When the contact materials 2 are applied to the rear surface of the base plate 1, the amount of the applied contact materials 2 is adjusted in accordance with a result of a test conducted by the flatness tester, that is to say, a bowed shape (e.g., irregularities of several to several hundred micrometers) at each location. As a result, the patterns of the plurality of contact materials 2 are formed as illustrated in FIGS. 2 and 3. Such an application method achieves optimum arrangements of the contact materials 2 based on the multiply bowed shape of the mounting surface of the semiconductor device.

Figure 4:
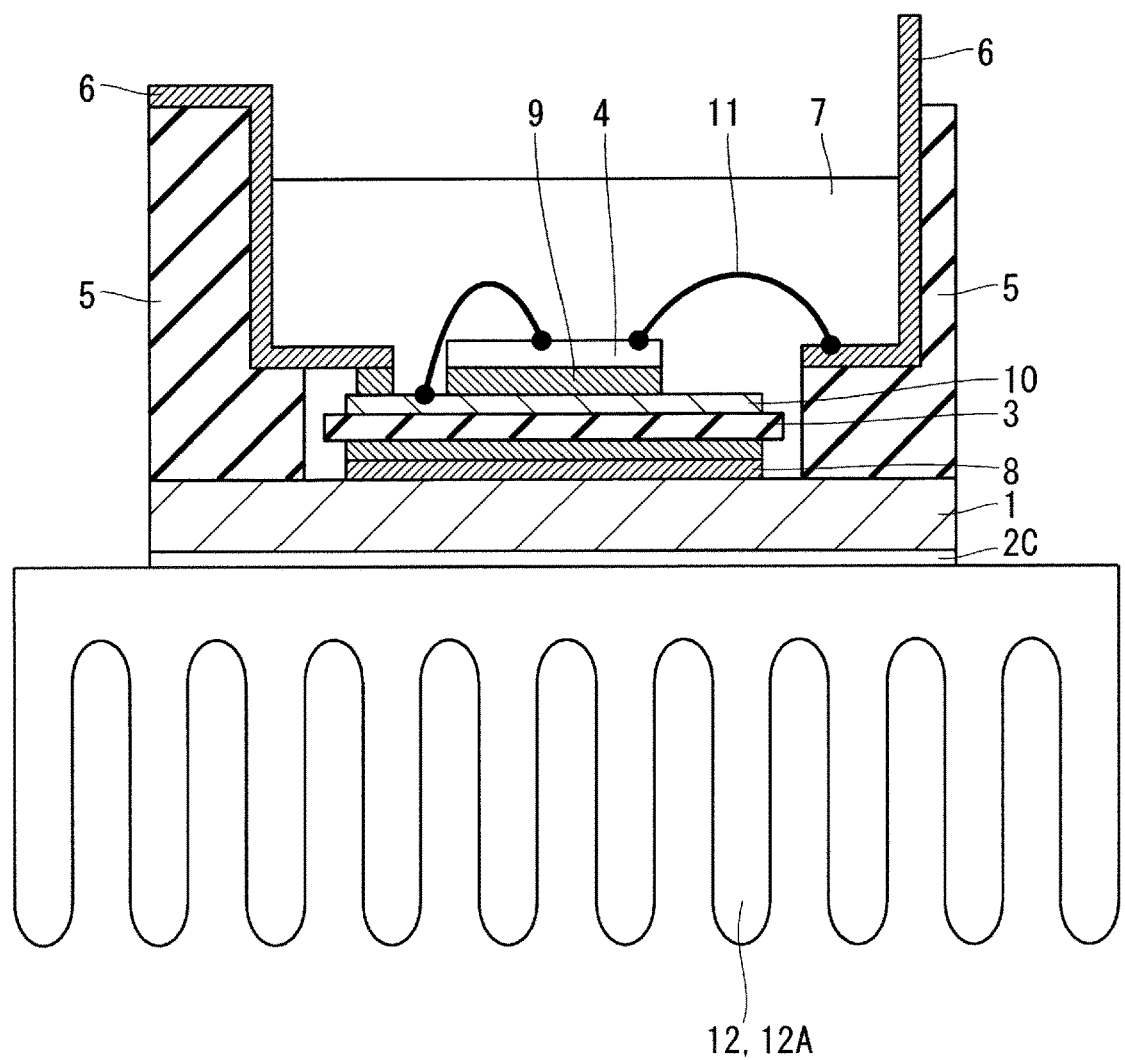
FIG. 4 is a sectional view illustrating a state of the semiconductor device in Embodiment 1 being attached to a cooling body through the contact materials.

FIG. 4 is a sectional view illustrating a state of the semiconductor device in Embodiment 1 being attached to a cooling body 12 through a contact material 2C. The cooling body 12 is herein a heat sink 12A including a plurality of heat dissipation fins. The heat sink 12A is made of aluminum and the like. The heat sink 12A is fastened to four corners of the base plate 1 with screws 13 as illustrated in FIG. 2. The plurality of contact materials 2 are compressed between the base plate 1 and the heat sink 12A just enough to uniformly spread as the contact material 2C. No gap (space) is formed on the heat dissipation path between the base plate 1 and the heat sink 12A. Favorable heat dissipation properties are thus secured.

In summary, the semiconductor device in Embodiment 1 includes the semiconductor element 4, the base plate 1, and the plurality of contact materials 2. The base plate 1 has the front surface holding the semiconductor element 4 and the rear surface to which the cooling body 12 to cool the semiconductor element 4 is attachable. The plurality of contact materials 2 are discretely arranged on the rear surface of the base plate 1. The plurality of contact materials 2 has a function to bridge the gap on the heat dissipation path between the base plate 1 and the cooling body 12. The plurality of contact materials 2 each have a volume based on the bowed shape of the rear surface of the base plate 1. From among the plurality of contact materials 2, the contact material 2A at the concave 21 of the bowed shape has a greater volume than the contact material 2B at the convex 22 of the bowed shape.

With this configuration, the semiconductor device achieves appropriate heat dissipation properties even in a case where the rear surface of the base plate 1 to which the cooling body 12 is to be attached, that is, the mounting surface has the bowed shape.

Embodiment 2

A semiconductor device in Embodiment 2 will be described. Embodiment 2 is a subordinate concept of Embodiment 1, and the semiconductor device in Embodiment 2 includes the components of the semiconductor device in Embodiment 1. Description on similar components and operation to those in Embodiment 1 will be omitted.

The semiconductor device in Embodiment 2 differs from that in Embodiment 1 in configuration of the plurality of contact materials 2. In Embodiment 2, from among the plurality of contact materials 2, a contact material disposed on a side of an outer periphery of the base plate 1 has a smaller volume than a contact material disposed on a central side of the base plate 1.

Since the heat sink 12A is fastened to the four corners of the base plate 1 with the screws 13, a contact pressure on the side of the outer periphery of the base plate 1 is higher than that on the central side of the base plate 1. The contact material on the side of the outer periphery of the base plate 1 thus spreads without forming a gap (space) between the base plate 1 and the heat sink 12A even if it is small in amount. Necessary heat dissipation properties are thus secured.

Embodiment 3

A semiconductor device in Embodiment 3 will be described. Embodiment 3 is a subordinate concept of Embodiment 1, and the semiconductor device in Embodiment 3 includes the components of the semiconductor device in Embodiment 1. Description on similar components and operation to those in Embodiment 1 or 2 will be omitted.

In Embodiment 3, the plurality of contact materials 2 include two or more patterns having different areas. For example, from among the plurality of contact materials 2, the contact material 2A at the concave 21 of the bowed shape has a greater area (pattern size) than the contact material 2B at the convex 22 of the bowed shape. The patterns of the contact materials 2 may have any shapes. The contact materials 2 may have the same height or different heights.

When the semiconductor device is attached to the heat sink 12A, the contact materials 2 spread without forming a gap (space) between the base plate 1 and the heat sink 12A. Favorable heat dissipation properties are thus achieved.

Embodiment 4

A semiconductor device in Embodiment 4 will be described. Embodiment 4 is a subordinate concept of Embodiment 1, and the semiconductor device in Embodiment 4 includes the components of the semiconductor device in Embodiment 1. Description on similar components and operation to those in any of Embodiments 1 to 3 will be omitted.

In a region in which the plurality of contact materials 2 are arranged and a region including a region near the region, the plurality of contact materials 2 have an area occupancy ratio based on the degree of undulation of the bowed shape. The degree of undulation corresponds to the depth of the depression as the concave 21 or the height of the protrusion as the convex 22. The area occupancy ratio is a ratio of the area of the plurality of contact materials 2 per unit area. For example, in the concave 21, an area occupancy ratio of the contact materials 2A in a region having a greater degree of depression is higher than an area occupancy ratio of the contact materials 2A in a region having a smaller degree of depression. In other words, more contact materials 2A are arranged in the region having the smaller degree of depression.

When the semiconductor device is attached to the heat sink 12A, the contact materials 2 spread without forming a gap (space) between the base plate 1 and the heat sink 12A. Favorable heat dissipation properties are thus achieved.

Embodiment 5

A semiconductor device in Embodiment 5 will be described. Embodiment 5 is a subordinate concept of Embodiment 1, and the semiconductor device in Embodiment 5 includes the components of the semiconductor device in Embodiment 1. Description on similar components and operation to those in any of Embodiments 1 to 4 will be omitted.

Figure 5:
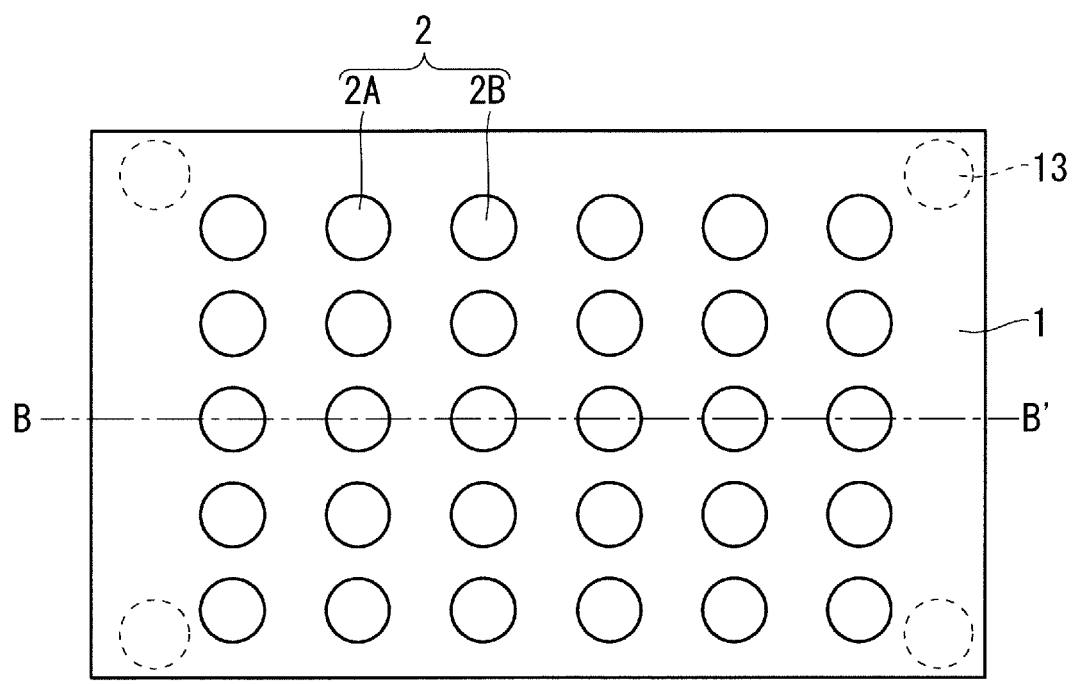
FIG. 5 is a plan view illustrating a configuration of a base plate and contact materials in Embodiment 5.
Figure 6:
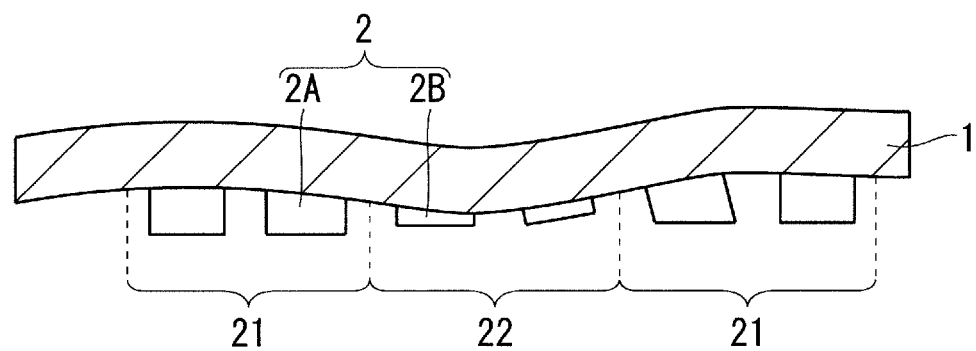
FIG. 6 is a sectional view illustrating the configuration of the base plate and the contact materials in Embodiment 5.

FIGS. 5 and 6 are respectively a plan view and a sectional view illustrating a configuration of the base plate 1 and the contact materials 2 in Embodiment 5. FIG. 6 illustrates a section taken along the line B-B' of FIG. 5.

The plurality of contact materials 2 include two or more patterns having the same area and different thicknesses. For example, from among the plurality of contact materials 2, the contact material 2A at the concave 21 of the bowed shape has a greater thickness than the contact material 2B at the convex 22 of the bowed shape. The patterns of the contact materials 2 may have any shapes.

With such a configuration, the volumes of the contact materials 2 are optimized by the thicknesses of the patterns. When the semiconductor device is attached to the heat sink 12A, the contact materials 2 spread without forming a gap (space) between the base plate 1 and the heat sink 12A. Favorable heat dissipation properties are thus achieved.

Embodiment 6

A semiconductor device in Embodiment 6 will be described. Embodiment 6 is a subordinate concept of Embodiment 1, and the semiconductor device in Embodiment 6 includes the components of the semiconductor device in Embodiment 1. Description on similar components and operation to those in any of Embodiments 1 to 5 will be omitted.

Figure 7:
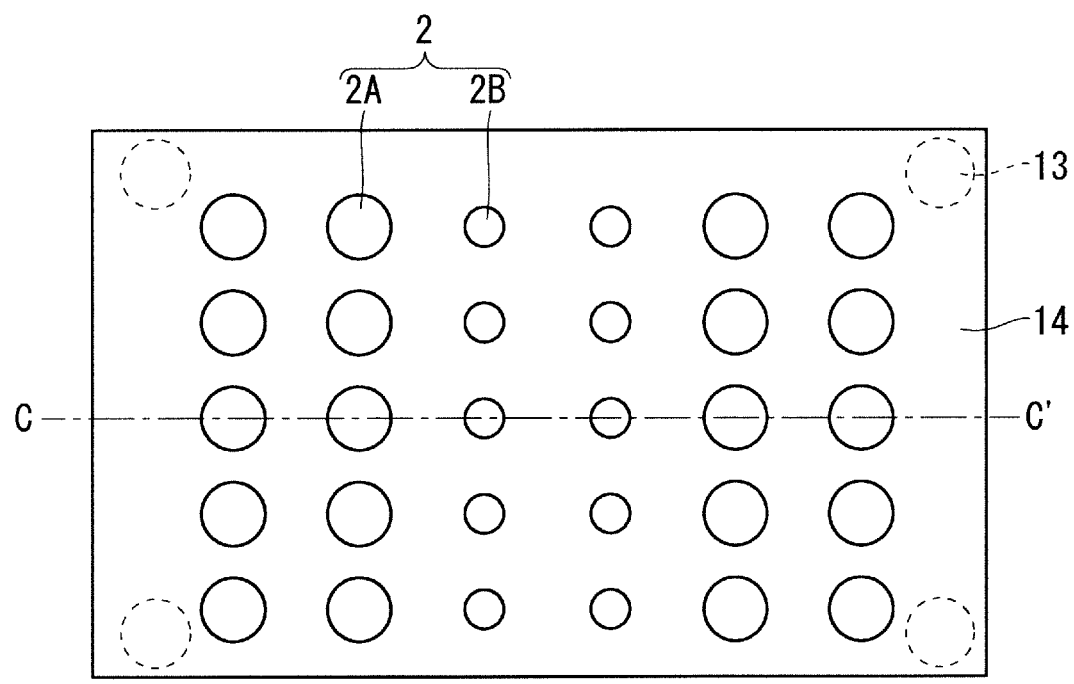
FIG. 7 is a plan view illustrating a configuration of a base plate and contact materials in Embodiment 6.
Figure 8:
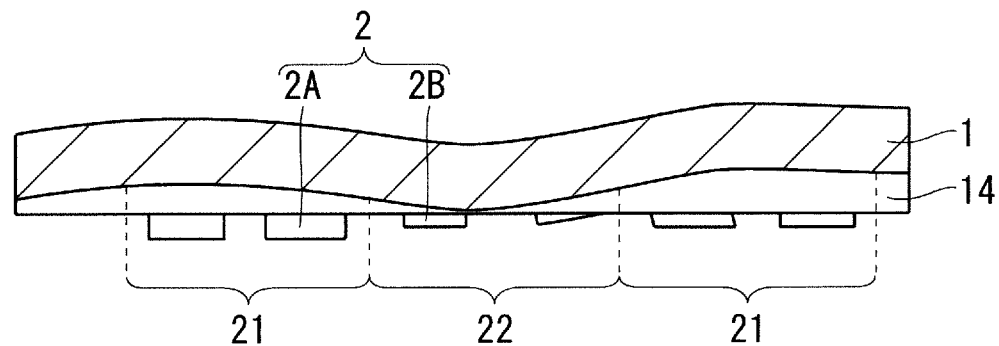
FIG. 8 is a sectional view illustrating the configuration of the base plate and the contact materials in Embodiment 6.

FIGS. 7 and 8 are respectively a plan view and a sectional view illustrating a configuration of the base plate 1 and the contact materials 2 in Embodiment 6. FIG. 8 illustrates a section taken along the line C-C' of FIG. 7.

The semiconductor device further includes a contact material layer 14 disposed on the rear surface of the base plate 1. The plurality of contact materials 2 are arranged on the contact material layer 14. In other words, the contact material layer 14 is disposed as a first layer, and the plurality of contact materials 2 are discretely arranged as a second layer. The contact material layer 14 as the first layer may be disposed in any region, and, as an example, the contact material layer 14 as the first layer is disposed on the entire rear surface of the base plate 1 in Embodiment 6. The contact material layer 14 as the first layer and the patterns of the plurality of contact materials 2 as the second layer are made of the same material. The plurality of contact materials 2 as the second layer each have a volume based on the degree of undulation of the bowed shape. The contact material layer 14 as the first layer preferably has a smaller thickness than the plurality of contact materials 2 as the second layer.

When the semiconductor device is attached to the heat sink 12A, the contact materials 2 spread without forming a gap (space) between the base plate 1 and the heat sink 12A. Favorable heat dissipation properties are thus achieved. The contact material layer 14 as the first layer also prevents possible chemical reaction caused on the rear surface of the base plate 1 before the semiconductor device is attached to the heat sink 12A. For example, the contact material layer 14 as the first layer prevents progress of oxidation or sulfuration of copper forming the base plate 1.

Embodiment 7

A semiconductor device in Embodiment 7 will be described. Embodiment 7 is a subordinate concept of Embodiment 1, and the semiconductor device in Embodiment 7 includes the components of the semiconductor device in Embodiment 1. Description on similar components and operation to those in any of Embodiments 1 to 6 will be omitted.

Figure 9:
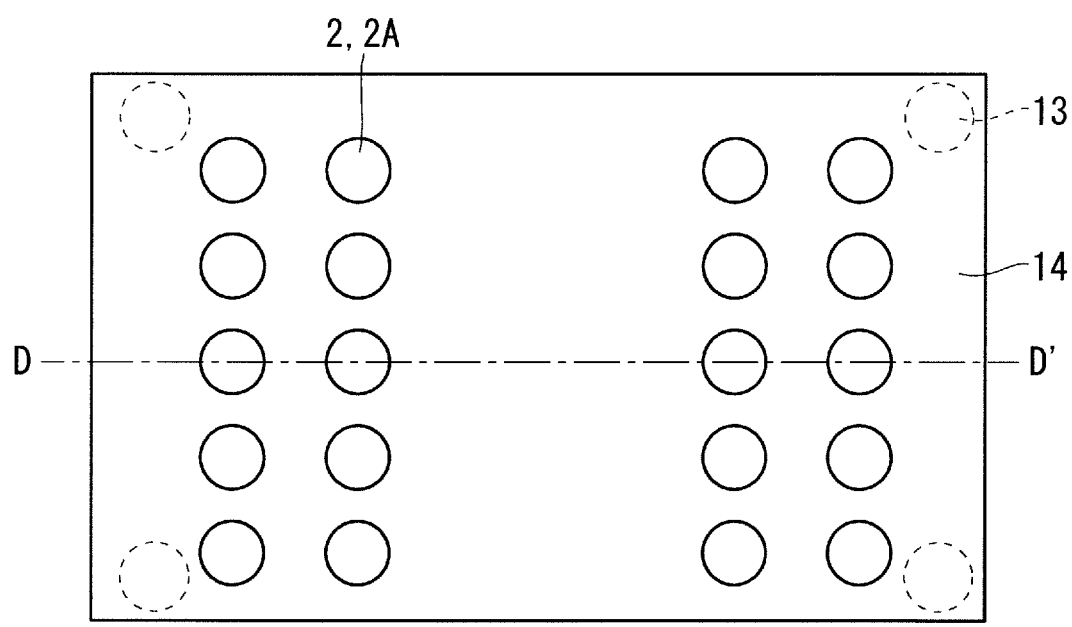
FIG. 9 is a plan view illustrating a configuration of a base plate and contact materials in Embodiment 7.
Figure 10:
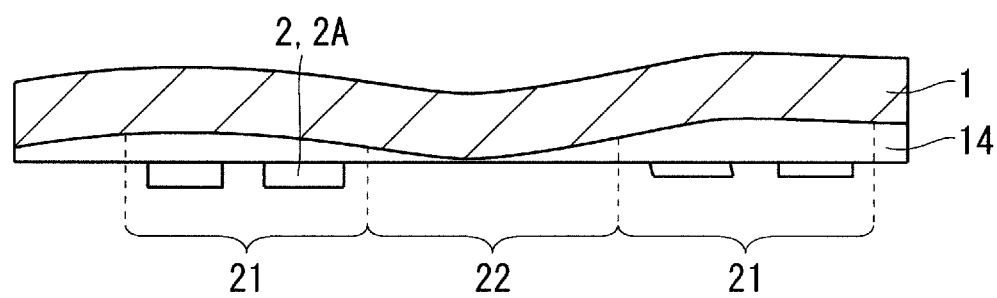
FIG. 10 is a sectional view illustrating the configuration of the base plate and the contact materials in Embodiment 7.

FIGS. 9 and 10 are respectively a plan view and a sectional view illustrating a configuration of the base plate 1 and the contact materials 2 in Embodiment 7. FIG. 10 illustrates a section taken along the line D-D' of FIG. 9.

As in Embodiment 6, the contact material layer 14 is disposed as the first layer, and the plurality of contact materials 2 are discretely arranged as the second layer. In Embodiment 7, however, the plurality of contact materials 2 are arranged in a part of the region in which the contact material layer 14 is disposed. The part of the region corresponds to a region in which the bowed shape of the base plate 1 meets a predetermined condition. The predetermined condition includes, for example, a condition on the depth or the degree of curvature of the concave 21 of the bowed shape. More specifically, the contact material 2A is disposed in a region in which the concave 21 has a depth greater than a predetermined depth. Alternatively, the contact material 2A is disposed in a region in which the concave 21 has a degree of curvature greater than a predetermined degree of curvature. On the other hand, in a case where the convex 22 of the bowed shape has a shape of a certain level or more, the contact material 2B is not disposed in the region.

When the semiconductor device is attached to the heat sink 12A, the contact materials 2 spread without forming a gap (space) between the base plate 1 and the heat sink 12A. Favorable heat dissipation properties are thus achieved. The contact material layer 14 as the first layer also prevents possible chemical reaction, specifically, progress of oxidation or sulfuration of metal forming the base plate 1, caused on the rear surface of the base plate 1 before the semiconductor device is attached to the heat sink 12A.

Embodiment 8

A semiconductor device in Embodiment 8 will be described. Embodiment 8 is a subordinate concept of Embodiment 1, and the semiconductor device in Embodiment 8 includes the components of the semiconductor device in Embodiment 1. Description on similar components and operation to those in any of Embodiments 1 to 7 will be omitted.

Figure 11:
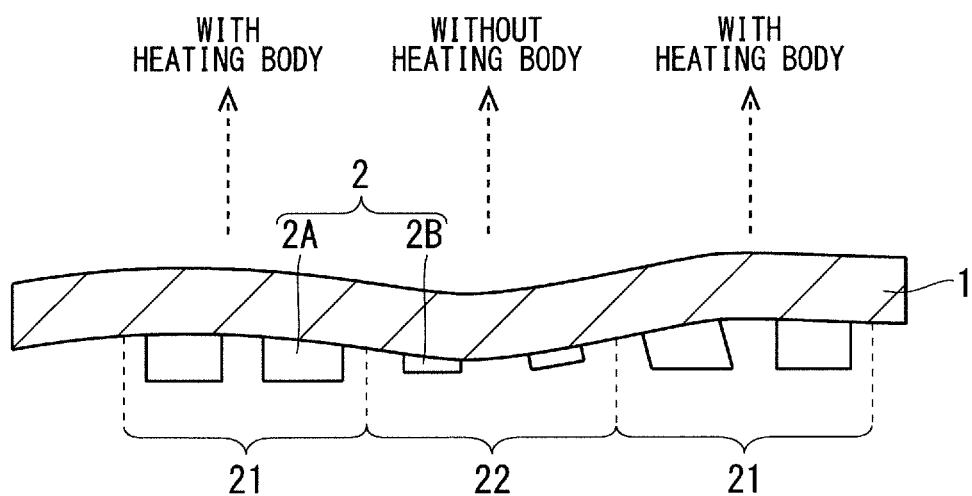
FIG. 11 is a sectional view illustrating a configuration of a base plate and contact materials in Embodiment 8.

FIG. 11 is a sectional view illustrating a configuration of the base plate 1 and the contact materials 2 in Embodiment 8. A heating body of the semiconductor device is disposed above the concave 21 of the bowed shape. The heating body is, for example, the semiconductor element 4 and a resistive element. The heating body may or may not be disposed above the convex 22 of the bowed shape. In Embodiment 8, an example in which the heating body is not disposed above the convex 22 of the bowed shape is shown.

In a conventional semiconductor device, the concave 21 is not sufficiently filled with the contact materials 2, and a space is likely to be formed in the concave 21. The contact materials 2 shown in each embodiment of the present description each have a volume based on the bowed shape, and thus spread without forming a gap (space) between the base plate 1 and the heat sink 12A. Favorable heat dissipation properties from the heating body to the cooling body 12 are thus achieved even in a case where the heating body is disposed above the concave 21.

Embodiment 9

A semiconductor device in Embodiment 9 will be described. Embodiment 9 is a subordinate concept of Embodiment 1, and the semiconductor device in Embodiment 9 includes the components of the semiconductor device in Embodiment 1. Description on similar components and operation to those in any of Embodiments 1 to 8 will be omitted.

Figure 12:
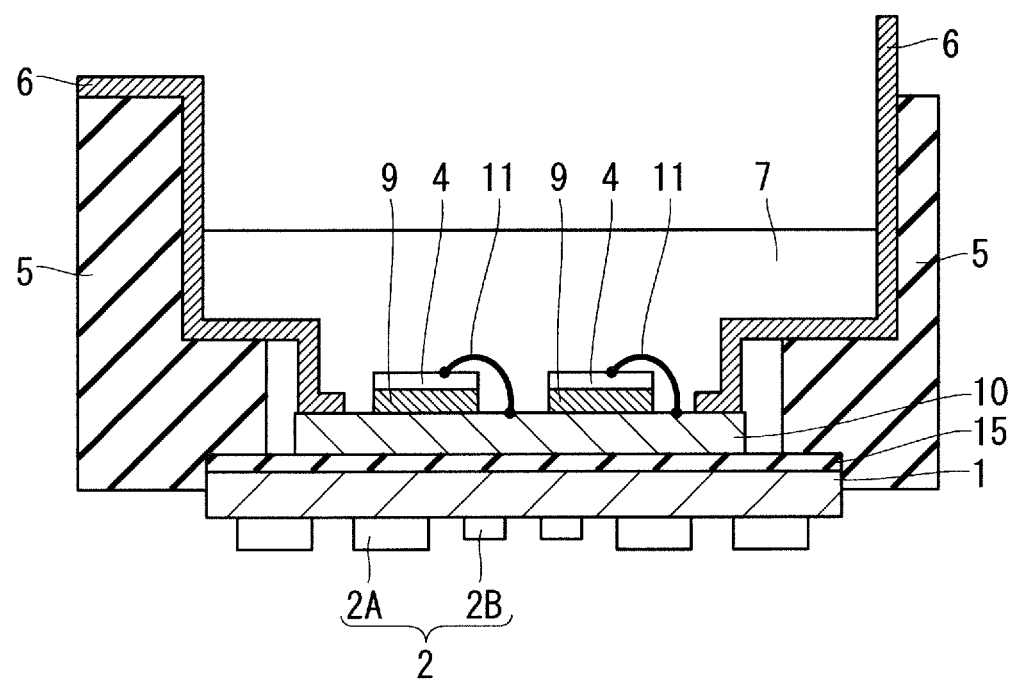
FIG. 12 is a sectional view illustrating a configuration of a semiconductor device in Embodiment 9.
Figure 13:
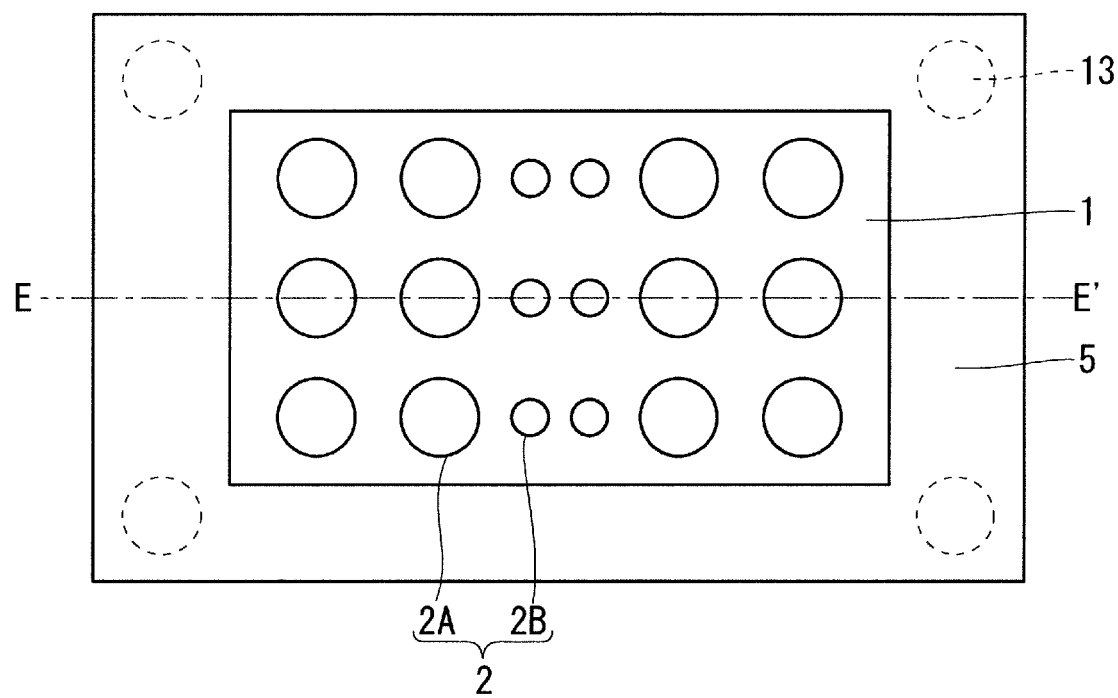
FIG. 13 is a plan view illustrating a configuration of a base plate and contact materials in Embodiment 9.
Figure 14:
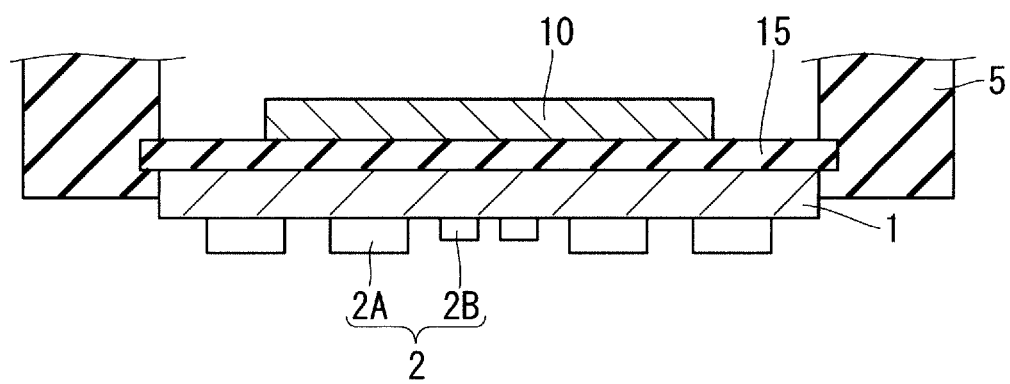
FIG. 14 is a sectional view illustrating a configuration of the base plate and the contact materials in Embodiment 9.

FIG. 12 is a sectional view illustrating a configuration of the semiconductor device in Embodiment 9. FIGS. 13 and 14 are respectively a plan view and a sectional view illustrating a configuration of the base plate 1 and the contact materials 2 in Embodiment 9. FIG. 14 illustrates a section taken along the line E-E' of FIG. 13.

The semiconductor device includes the base plate 1, the plurality of contact materials 2, an insulating member 15, the semiconductor element 4, the case 5, the electrode terminal 6, and the sealing material 7. The plurality of contact materials 2, the semiconductor element 4, the case 5, the electrode terminal 6, and the sealing material 7 have similar configurations to those in Embodiment 1.

The insulating member 15 is disposed to be in direct contact with the front surface of the base plate 1. The insulating member 15 is, for example, resin. The semiconductor element 4 is bonded to the circuit pattern 10 disposed on a front surface of the insulating member 15. The insulating substrate 3 is bonded to the front surface of the base plate 1 through the bonding material 8 in Embodiment 1, but the bonding material 8 is not disposed between the insulating member 15 and the base plate 1 in Embodiment 9. The insulating member 15 and the base plate 1 are integral parts.

Figure 15:
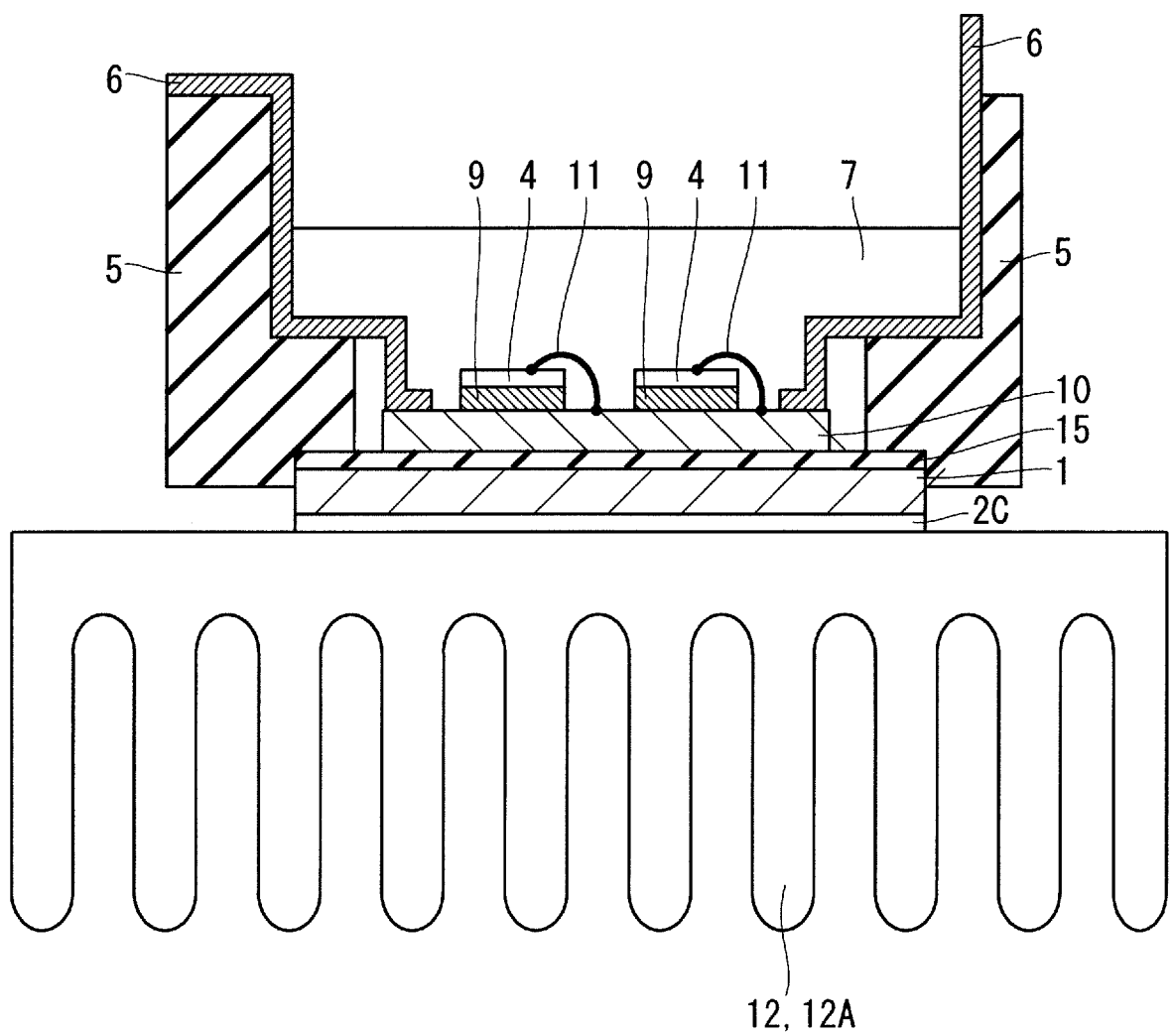
FIG. 15 is a sectional view illustrating a state of the semiconductor device in Embodiment 9 being attached to a cooling body through the contact materials.

FIG. 15 is a sectional view illustrating a state of the semiconductor device in Embodiment 9 being attached to the cooling body 12 through the contact materials 2. The plurality of contact materials 2 are compressed to spread between the base plate 1 and the heat sink 12A (cooling body 12), and then the space is filled with a uniform contact material 2C. No gap (space) is formed on the heat dissipation path between the base plate 1 and the heat sink 12A. Favorable heat dissipation properties are thus secured. In Embodiment 9, thermal resistance between the semiconductor element 4 and the heat sink 12A is reduced to improve the heat dissipation properties.

Embodiment 10

A semiconductor device manufacturing method in Embodiment 10 will be described. Description on similar components and operation to those in any of Embodiments 1 to 9 will be omitted.

Figure 16:
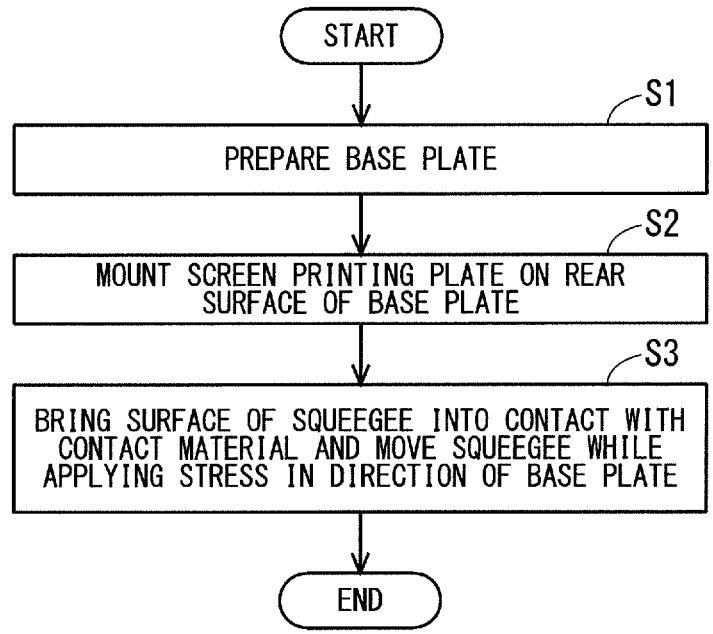
FIG. 16 is a flowchart showing a semiconductor device manufacturing method in Embodiment 10.

FIG. 16 is a flowchart showing the semiconductor device manufacturing method in Embodiment 10.

In a step S1, the base plate 1 is prepared. The base plate 1 has the front surface holding the semiconductor element 4 and the rear surface to which the cooling body 12 to cool the semiconductor element 4 is attachable.

Figure 17:
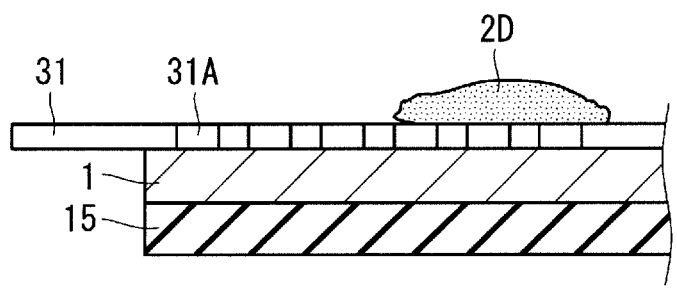
FIG. 17 illustrates a screen printing plate mounted on a rear surface of a base plate in Embodiment 10.

In a step S2, a screen printing plate is mounted on the rear surface of the base plate 1. FIG. 17 illustrates a screen printing plate 31 mounted on the rear surface of the base plate 1 in Embodiment 10. The screen printing plate 31 has a flat surface, and has a plurality of holes 31A in the flat surface as a mask pattern. The holes 31A each have individual sizes. The screen printing plate 31 has a constant thickness. A contact material 2D is supplied onto the flat surface of the screen printing plate 31.

Figure 18:
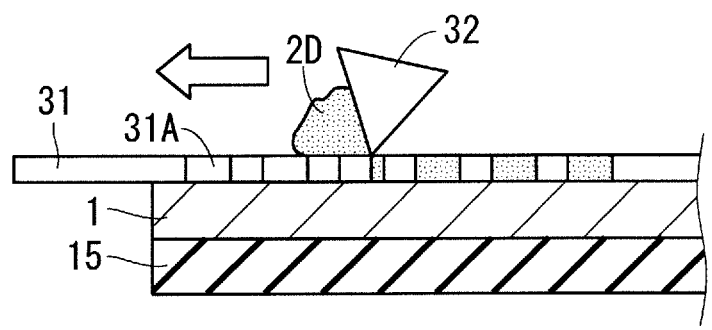
FIG. 18 illustrates a moving state of a squeegee in Embodiment 10.

In a step S3, a surface of a squeegee is brought into contact with the contact material 2D supplied onto the flat surface of the screen printing plate 31, and the squeegee is moved while stress is applied to the squeegee in a direction of the base plate 1. The surface of the squeegee is an inner surface of the squeegee oriented in a direction of movement of the squeegee. FIG. 18 illustrates a moving state of a squeegee 32. In this step S3, the plurality of holes 31A are filled with the contact material 2D, and the plurality of contact materials 2 are patterned. In this case, the magnitude of the stress to be applied to the squeegee 32 may be adjusted based on the bowed shape of the rear surface of the base plate 1 measured in advance. Specifically, greater stress may be applied at the concave 21 than at the convex 22. The contact material 2A at the concave 21 has a greater volume than the contact material 2B at the convex 22 of the bowed shape.

Figure 19:
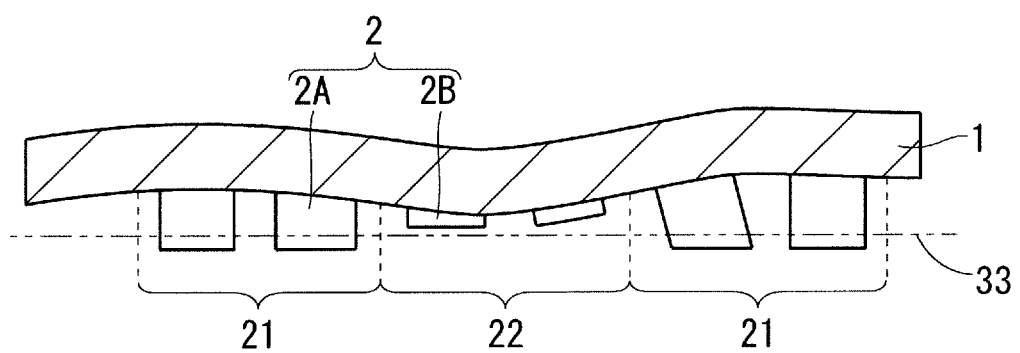
FIG. 19 is a sectional view illustrating a configuration of the base plate and contact materials in Embodiment 10.

The plurality of contact materials 2 are thereby discretely arranged on the rear surface of the base plate 1. FIG. 19 is a sectional view illustrating a configuration of the base plate 1 and the contact materials 2 in Embodiment 10. A broken line 33 shown in FIG. 19 indicates the thickness of the contact materials formed in a case where the stress to be applied is not adjusted. By adjusting the stress, a greater amount of the contact materials 2 can intentionally be supplied to the concave 21 than to the convex 22.

The semiconductor device is then attached to the heat sink 12A. The plurality of contact materials 2 are compressed between the base plate 1 and the heat sink 12A to spread without forming a gap (space). Favorable heat dissipation properties are thus achieved.

A method of forming the patterns of the contact materials 2 by printing is suitable for the semiconductor device in which the rear surface of the base plate 1 has a single bow, but is originally not suitable for the semiconductor device multiply bowed. A conventional method has a problem in that thin contact materials 2 are only formed by the influence of bows of the base plate 1 although thick contact materials 2 should originally be printed, for example. According to the semiconductor device manufacturing method in Embodiment 10, however, the greater amount of the contact materials 2 can be supplied to the concave 21 than to the convex 22 through adjustment of the stress to be applied. The manufacturing method allows for a process of printing the contact materials 2 in view of the bowed shape of the mounting surface of the semiconductor device. As a result, favorable heat dissipation properties are achieved even in a case where the mounting surface of the semiconductor device has the bowed shape.

Embodiments of the present disclosure can freely be combined with each other, and can be modified or omitted as appropriate.

While the present disclosure has been described in detail, the foregoing description is in all aspects illustrative and not restrictive. It is therefore understood that numerous modifications not having been described can be devised without departing from the scope of the present disclosure.

What is claimed is:

1. A semiconductor device comprising:
   a semiconductor element;
   a base plate having a front surface holding the semiconductor element and a rear surface to which a cooling body to cool the semiconductor element is attachable;
   a plurality of contact materials discretely arranged on the rear surface of the base plate and for bridging a gap on a heat dissipation path between the base plate and the cooling body; and
   a contact material layer continuously and entirely disposed on the rear surface of the base plate as a first layer, wherein
   the plurality of contact materials each have a volume based on a bowed shape of the rear surface of the base plate,
   from among the plurality of contact materials, a contact material at a concave of the bowed shape has a greater volume than a contact material at a convex of the bowed shape, and
   the plurality of contact materials are arranged separately on the contact material layer as a second layer.

2. The semiconductor device according to claim 1, wherein
   from among the plurality of contact materials, a contact material disposed on a side of an outer periphery of the base plate has a smaller volume than a contact material disposed on a central side of the base plate.

3. The semiconductor device according to claim 1, wherein
   the plurality of contact materials include two or more patterns having different areas.

4. The semiconductor device according to claim 1, wherein
   the plurality of contact materials have an area occupancy ratio based on a degree of undulation of the bowed shape, the area occupancy ratio being a ratio of area of the plurality of contact materials per unit area.

5. The semiconductor device according to claim 1, wherein
   the plurality of contact materials include two or more patterns having the same area and different thicknesses.

6. The semiconductor device according to claim 1, wherein
   the plurality of contact materials are arranged in a part of a region in which the contact material layer is disposed, the part of the region being a region in which the bowed shape of the base plate meets a predetermined condition on the bowed shape.

7. The semiconductor device according to claim 1, wherein
   a heating body including the semiconductor element is disposed above the concave.

8. The semiconductor device according to claim 1, further comprising
   an insulating member being in direct contact with the front surface of the base plate, wherein
   the semiconductor element is bonded to a circuit pattern disposed on a front surface of the insulating member.

9. A semiconductor device manufacturing method comprising the steps of:
   preparing a base plate having a front surface holding a semiconductor element and a rear surface to which a cooling body to cool the semiconductor element is attachable;
   arranging a contact material layer continuously and entirely on the rear surface of the base plate, as a first layer; and
   discretely arranging a plurality of contact materials for bridging a gap on a heat dissipation path between the base plate and the cooling body, on the contact material layer as a second layer, wherein
   the plurality of contact materials each have a volume based on a bowed shape of the rear surface of the base plate,
   from among the plurality of contact materials, a contact material at a concave of the bowed shape has a greater volume than a contact material at a convex of the bowed shape, and
   the step of arranging the plurality of contact materials includes the substeps of:

mounting, on the rear surface of the base plate, a screen printing plate having a flat surface and having a plurality of holes in the flat surface; and bringing a surface of a squeegee into contact with a contact material supplied onto the flat surface of the screen printing plate, and moving the squeegee while applying stress to the squeegee in a direction of the base plate to fill the plurality of holes and to pattern the plurality of contact materials.

* * * * *